US008896390B2

(12) United States Patent
    Chen

(10) Patent No.: US 8,896,390 B2
(45) Date of Patent: Nov. 25, 2014

(54) CIRCUIT OF INDUCTANCE/CAPACITANCE (LC) VOLTAGE-CONTROL OSCILLATOR

(75) Inventor: Chih-Hung Chen, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 170 days.

(21) Appl. No.: 13/517,560

(22) Filed: Jun. 13, 2012

(65) Prior Publication Data

US 2013/0285756 A1    Oct. 31, 2013

(30) Foreign Application Priority Data

Apr. 26, 2012  (TW) .............................. 101114940 A

(51) Int. Cl.
    *H03L 5/00*    (2006.01)
    *H03B 5/00*    (2006.01)
    *H03B 5/12*    (2006.01)

(52) U.S. Cl.
    CPC ................ *H03B 5/00* (2013.01); *H03B 5/1234* (2013.01); *H03B 5/1278* (2013.01)
    USPC ................. 331/183; 331/117 R; 331/117 FE; 331/167; 331/182; 331/185; 331/186

(58) Field of Classification Search
    CPC ....... H03B 5/1234; H03B 5/1278; H03L 5/00
    USPC ........ 331/117 R, 117 FE, 167, 182, 183, 185, 331/186
    See application file for complete search history.

(56) References Cited

U.S. PATENT DOCUMENTS

| 6,064,277 | A  | * | 5/2000 | Gilbert ...................... 331/117 R |
| 6,680,655 | B2 | * | 1/2004 | Rogers ........................... 331/109 |
| 6,909,336 | B1 | * | 6/2005 | Rajagopalan et al. ........ 331/183 |
| 7,564,320 | B2 | * | 7/2009 | Chiu et al. .................... 331/185 |
| 7,940,137 | B2 | * | 5/2011 | Rosik et al. ............... 331/116 R |
| 2005/0212611 | A1 | * | 9/2005 | Muthali et al. ............ 331/117 R |
| 2008/0048795 | A1 | * | 2/2008 | Hoshino et al. ............... 331/183 |

* cited by examiner

*Primary Examiner* — Arnold Kinkead
*Assistant Examiner* — Richard Tan
(74) *Attorney, Agent, or Firm* — J.C. Patents

(57) ABSTRACT

A circuit of inductance/capacitance (LC) voltage control oscillator (VCO) includes an LC VCO unit, a peak detector and a processing unit. The LC VCO unit receives a current control signal and outputs an oscillating voltage signal. The peak detector receives the oscillating voltage signal to obtain an averaged voltage value. The processing unit receives the averaged voltage value to accordingly output the current control signal and feedback to the LC VCO unit. The processing unit also detects whether or not the averaged voltage value has reached to a saturation state and a corresponding critical current. After the current control signal reaches to the critical current, the current control signal is set within a variance range near the critical current.

11 Claims, 5 Drawing Sheets

US 8,896,390 B2

CIRCUIT OF INDUCTANCE/CAPACITANCE (LC) VOLTAGE-CONTROL OSCILLATOR

CROSS-REFERENCE TO RELATED APPLICATION

This application claims the priority benefit of Taiwan application serial no. 101114940, filed on Apr. 26, 2012. The entirety of the above-mentioned patent application is hereby incorporated by reference herein and made a part of this specification.

BACKGROUND

1. Field of Invention

The invention relates to circuit of inductance/capacitance (LC) voltage-controlled oscillator.

2. Description of Related Art

It needs to consider several factors for the performance of inductance/capacitance (LC) voltage-control oscillator (LC VCO) in the current wireless communication system, including phase noise and tuning rage of frequency. In order to have both these characteristics, a mechanism of switching capacitance is usually taken. It can reduce the gain (Kvco) of the LC VCO, so as to obtain a relative level of phase noise while the tuning rage of frequency can still be wide.

However, the inductance quality factor (Q) of the LC VCO operated at different frequencies may vary in a large range. This causes a difficulty to obtain a proper phase noise for all operation frequency of the LC VCO. In addition, the output amplitude is also varying in a large range. This also causes the difficulty to design the buffer and frequency mixer, which are coupled after the LC VCO. Further, it may also cause a lot of power consumption.

SUMMARY OF THE INVENTION

The invention provides the technology, capable of automatically detecting and adjusting the size of output amplitude of the LC VCO. It can save the power consumption for all of the operation frequencies and can have better condition of phase noise. The output can basically have a constant amplitude.

In an embodiment of the invention, a circuit of LC VCO is provided, including an LC VCO unit, a peak detector and a processing unit. The LC VCO unit receives a current control signal and outputs an oscillating voltage signal. The peak detector receives the oscillating voltage signal to obtain an averaged voltage value. The processing unit receives the averaged voltage value to accordingly output the current control signal and feedback to the LC VCO unit. The processing unit also detects whether or not the averaged voltage value has reached to a saturation state, corresponding to a critical current. After the current control signal reaches to the critical current, the current control signal is set within a variance range near the critical current.

In an embodiment of the invention, a circuit of LC VCO is provided, including an LC VCO unit, a peak detector, a comparator, and a processing unit. The LC VCO unit receives a current control signal and outputs an oscillating voltage signal. The peak detector receives the oscillating voltage signal to obtain an averaged voltage value. The comparator receives a reference voltage and the averaged voltage value, so as to output a comparison signal to the processing unit to indicate whether or not the averaged voltage value has reached to a level of the reference voltage. The processing unit receives the averaged voltage value and the comparison signal and detects whether or not the averaged voltage value has reached to a saturation state and a critical current in correspondence. When the averaged voltage value has not reached to the saturation state yet, the current control signal is provided, according to the averaged voltage value or the comparison signal, to control the LC VCO unit. After the current control signal reaches to the critical current, the current control signal is set within a variance range near the critical current.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The invention analyzes the performance of a usual circuit of LC VCO. When the capacitance is larger, the oscillating frequency is less but the Q factor of the LC becomes smaller. This would cause the phase noise to be larger and the output amplitude to be smaller.

Figure 1:
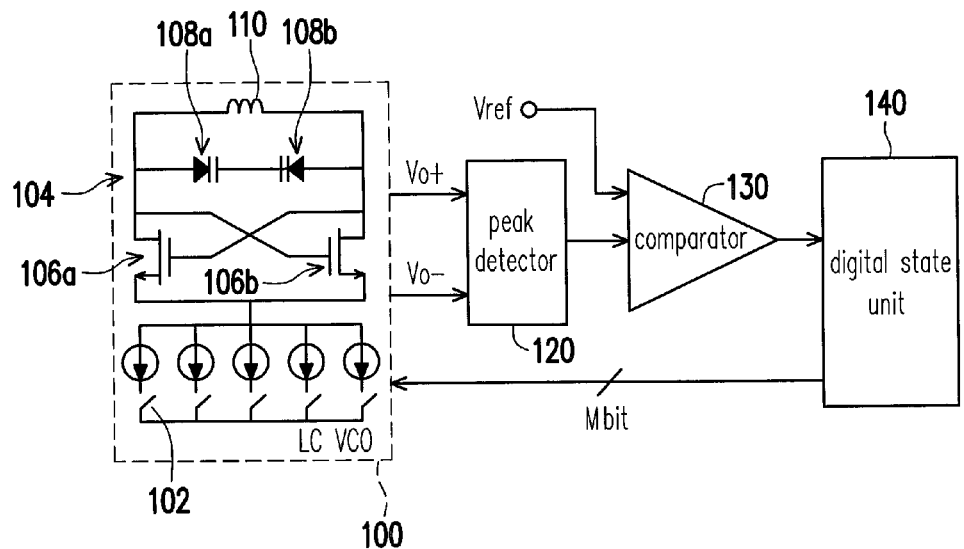
FIG. 1 is a drawing, schematically illustrating a circuit of LC VCO.

FIG. 1 is a drawing, schematically illustrating a circuit of LC VCO. In FIG. 1, the circuit of LC VCO includes a LC VCO 100, a peal detector 120, a comparator 130 and a digital state unit 140.

The LC VCO 100 includes a current source unit 102 and an LC circuit 104. The LC circuit 104 in an example includes a pair of field-effect transistors (FET's) 106a and 106b with cross connection between the gates and the sources; a pair of semiconductor capacitors 108a and 108b; and an inductor 110. The LC VCO 100 outputs, for example, two oscillating sine-wave voltage signals Vo+ and Vo− which have a phase difference by 180 degrees.

The peak detector 120 receives the sine-wave voltage signals Vo+ and Vo− to detect the DC averaged voltage value, which represents the voltage amplitude of the output signal.

The current size of the current source unit 102 would change the voltage amplitude of output signal. In order to reach to the predetermined voltage amplitude, the current needs to be increased. The comparator 130 receives the averaged voltage value from the peak detector 120 and a reference voltage value, and then outputs a comparison signal to the digital state unit 140. The digital state unit 140 can accordingly know the state of output voltage and output current control signal to the current unit 102 of the LC VCO 100. The current unit 102 is for example composed of M current source units. The current control signal output from the digital state unit 140 is also a M-bit signal, to determine the activated state of the M current source units, so that the current can be controlled.

In the circuit of LC VCO of FIG. 1, for easy descriptions, the output current of the LC VCO 100 is indicated by Ib, the output amplitude is indicated by Vo, the phase noise is indicated by PN, and a maximum of the output amplitude is indicated by Vmax. The invention analyzes the performance of the circuit of LC VCO in FIG. 1. It turns out that when the output amplitude Vo has a phenomenon of saturation and the phase noise would be at the minimum when saturation occurs. In other words, the output amplitude Vo is not always linearly increasing with the current Ib and the phase noise is not always linearly decreasing with the current Ib.

Figures 2A, 2B:
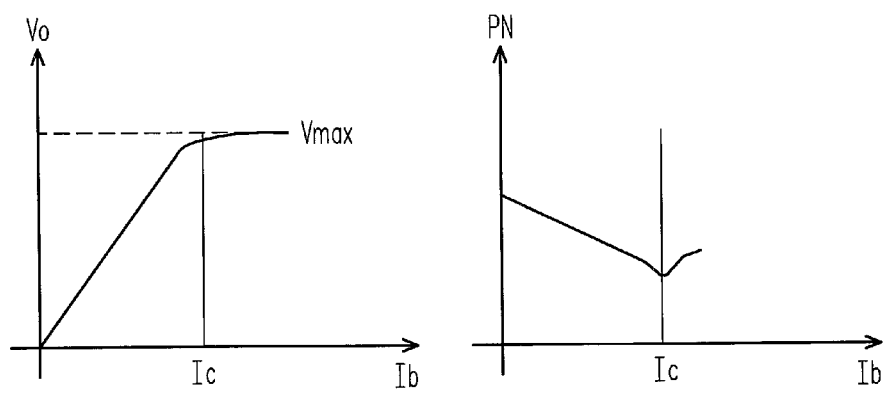
FIGS. 2A-2B are drawings, schematically illustrating varying relations of phase noise (PN) and output amplitude (Vo) versus the control current (Ib), according to a preferred embodiment of the invention.

FIGS. 2A-2B are drawings, schematically illustrating varying relations of phase noise (PN) and output amplitude (Vo) versus the control current (Ib), according to a preferred embodiment of the invention.

In FIG. 2A, viewing from the change of the output amplitude with respect to the current Ib, when the current Ib is less than the critical current Ic, the output amplitude Vo has the linearly change versus the current Ib. However, when the current Ib is approaching to the critical current Ic, the output amplitude Vo becomes saturation and reaches to the maximum Vmax. In other words, when the current Ib increase over the critical current Ic, the output amplitude is no longer linearly increasing and would be saturation. Here, the critical current Ic is used to indicate the status that the linear variation is no longer maintained and would approaching to saturation. The actual setting value of the critical current can be determined by observing the actual phenomenon of saturation.

The Vmax value in different circuit structure of LC VCO for the same power supply voltage is a constant requirement. When the amplitude reaches to the Vmax, the output amplitude is not increased even if the current is further increased.

When the analyses further involves the consideration of the phase noise PN in FIG. 2B, the occurrence of the critical current Ic is consisting with the minimum of phase noise PN. The minimum of phase noise PH is at the critical current Ic.

After analyzing the circuit of LC VCO, the detection on the critical current Ic is proposed. When the current increases up to the critical current Ic, the current may not be further continuously increased, so the power consumption can be at least saved.

Several embodiments are provided for description. However, the invention is not just limited to the embodiments. A proper combination may be made between the embodiments under actual need.

Figure 3:
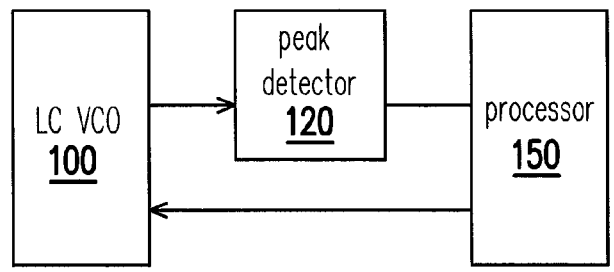
FIG. 3 is a drawing, schematically illustrating a circuit of LC VCO according to an embodiment of the invention.

FIG. 3 is a drawing, schematically illustrating a circuit of LC VCO according to an embodiment of the invention. In FIG. 3, the circuit of LC VCO includes an LC VCO unit 100, a peak detector 120 and a processor 150.

The further circuits of the LC VCO unit 100 and the peak detector 120 in detail can be like circuits of the LC VCO unit 100 and the peak detector 120 in FIG. 1 and no further description in detail is provided.

In the embodiment, the processing unit 150 would take different operations form the circuit in FIG. 1, according to the phenomena in FIG. 2A-2B. For the whole aspect, the LC VCO 100 receives a current control signal, such a M-bit signal, to output an oscillating voltage signal, such as two oscillating voltage signals Vo+ and Vo−. The peak detector 120 receives the oscillating voltage signal to obtain an averaged voltage value. The processor 150, also called processing unit 150, receives the averaged value and outputs the current control signal to feedback to the LC VCO 100 according the averaged voltage value. The processor 150 also detects whether or not the current control signal in corresponding to the averaged voltage value has reached to a saturation state and a corresponding critical current. After the current control signal has reached to the critical current, the current control signal is set to a level near the critical current within a variance range. Here, the small variance range near the critical current is reasonably set according to the actual need, usually corresponding to the minimum of the phase noise or the critical current approaching the saturation region of voltage.

Figure 4:
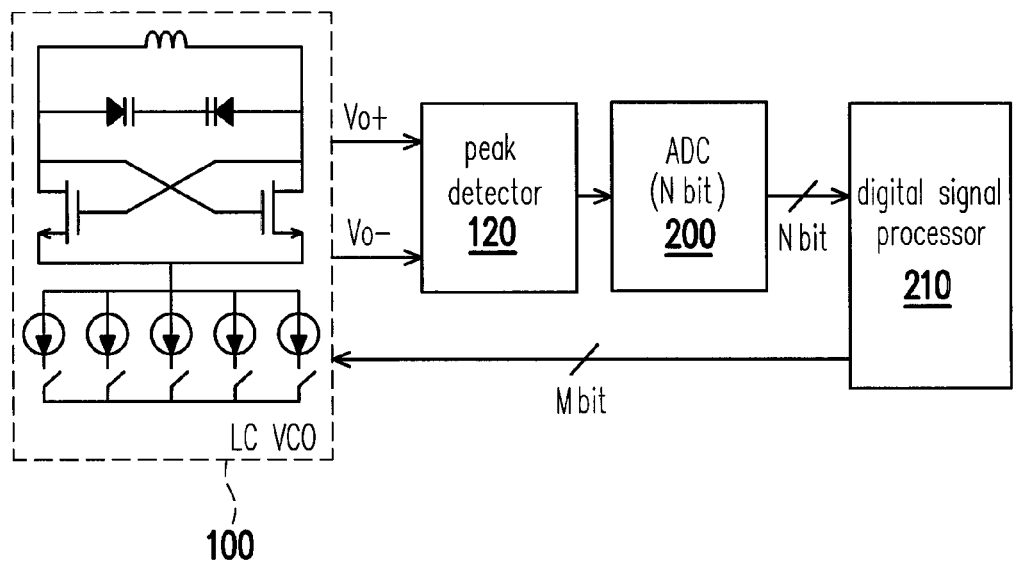
FIG. 4 is a drawing, schematically illustrating a circuit of LC VCO according to an embodiment of the invention.

FIG. 4 is a drawing, schematically illustrating a circuit of LC VCO according to an embodiment of the invention. In FIG. 4 as to the processor 150, it can further include analog-to-digital converter (ADC) circuit for analyses. The processor 3 in FIG. 3 can include, for example, an ADC circuit 200 and a digital signal processor 210. The ADC circuit has the resolution of N bits, for example, so as to convert the averaged voltage value into digital data. The digital signal processor 210 can at least analyze the variance of the averaged voltage value and other need in analyses, so as to determine the critical current Ic based on the mechanism in FIGS. 2A-2B.

From another point of view, the ADC circuit 200 is coupled after the peak detector 120. The output of the ADC circuit 200 is further coupled to the digital signal processor 210, which is for judging and recoding the size of the amplitude and then outputs an M-bit signal to control current.

At the beginning stage, when the LC VCO 100 is switched to an operation frequency, the peak detector 120 starts to detect the amplitude. The amplitude is digitized by the ADC circuit 200 and then inputted to the digital signal processor 210. The digital signal processor 210 would increase the current of the LC VCO 100 and keeps on recording the size of the amplitude. When the amplitude is not substantially increasing even if the current is increased, it then approaches to the saturation condition, and the current is no longer further increased. The phase noise at this moment under the operation frequency is also approaching to the minimum.

According to the foregoing correction manner, it can have constant amplitude and relatively smaller phase noise for operation in different oscillating frequencies, and does not waste current.

The LC VCO 100 can expand the adjustable range for oscillating frequency by taking capacitors coupled in parallel.

The peak detector 120 can convert the output amplitude from the LC VCO 100 into a DC voltage value.

The digital signal processor 210 can control the current of the LC VCO 100 and record the size of the amplitude, and further judge when to stop increasing current.

By the foregoing correction mechanism for continuously correction, the optimized phase noise for different oscillating frequency can be obtained. In addition, the output amplitude can be constant with wasting current.

Figure 5:
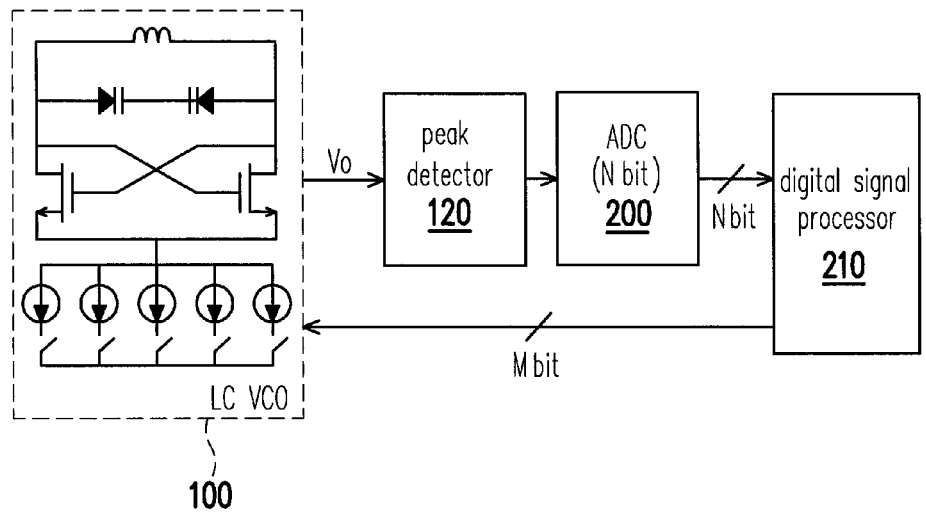
FIG. 5 is a drawing, schematically illustrating a circuit of LC VCO according to an embodiment of the invention.

FIG. 5 is a drawing, schematically illustrating a circuit of LC VCO according to an embodiment of the invention. In FIG. 5, it is similar to FIG. 4 but the output of the LC VCO 100 for the peak detector 120 can be a single oscillating signal Vo for detecting the averaged voltage value. The peak detector 120 is to provide the state of the output amplitude. It can also be alternatively done by analyzing out from a single oscillating signal Vo. Further in alternative manner, the peak detector 120 may also implemented with a delay circuit to obtain the oscillation signals of Vo+ and Vo−. In other words, the output of the LC VCO for the peak detector is not limited to a specific form. It can be any proper signal form, which allows the subsequent analyses to detect whether or not the saturation has been reached to.

Figure 6:
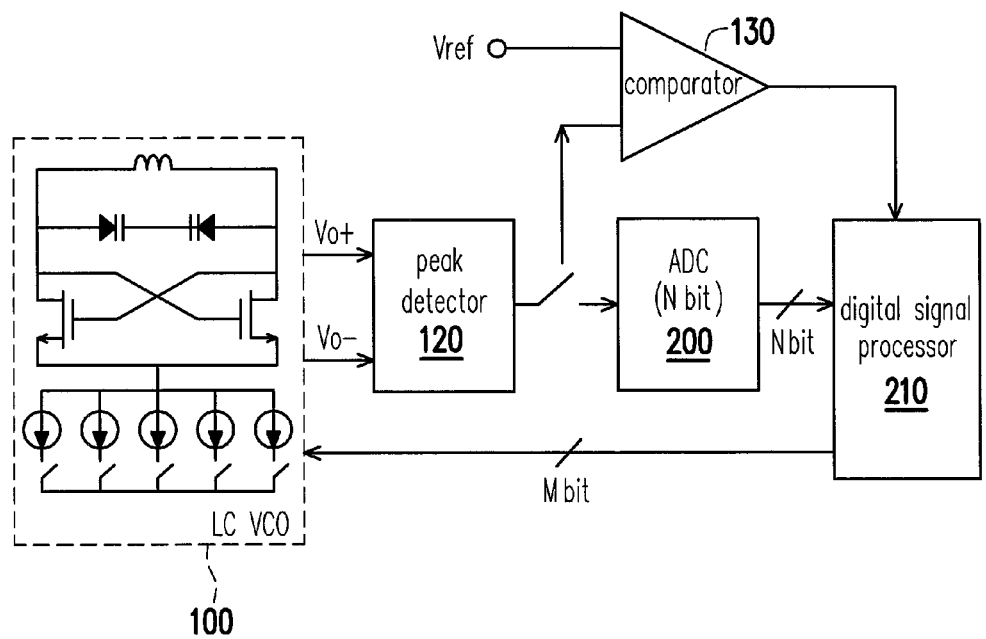
FIG. 6 is a drawing, schematically illustrating a circuit of LC VCO according to an embodiment of the invention.

FIG. 6 is a drawing, schematically illustrating a circuit of LC VCO according to an embodiment of the invention. In FIG. 6, based on the example in FIG. 4, it can combine the circuit design in FIG. 1. The output of the peak detector 120 can be switched by a switching circuit, so as to select the path through the comparator 130 for output the signal, or select the path based on the detection mechanism in FIG. 4. The digital signal processor 210 may perform different process according to the different input signal source. Thus, the embodiment in FIG. 6 can have two operation modes in option.

Figure 7:
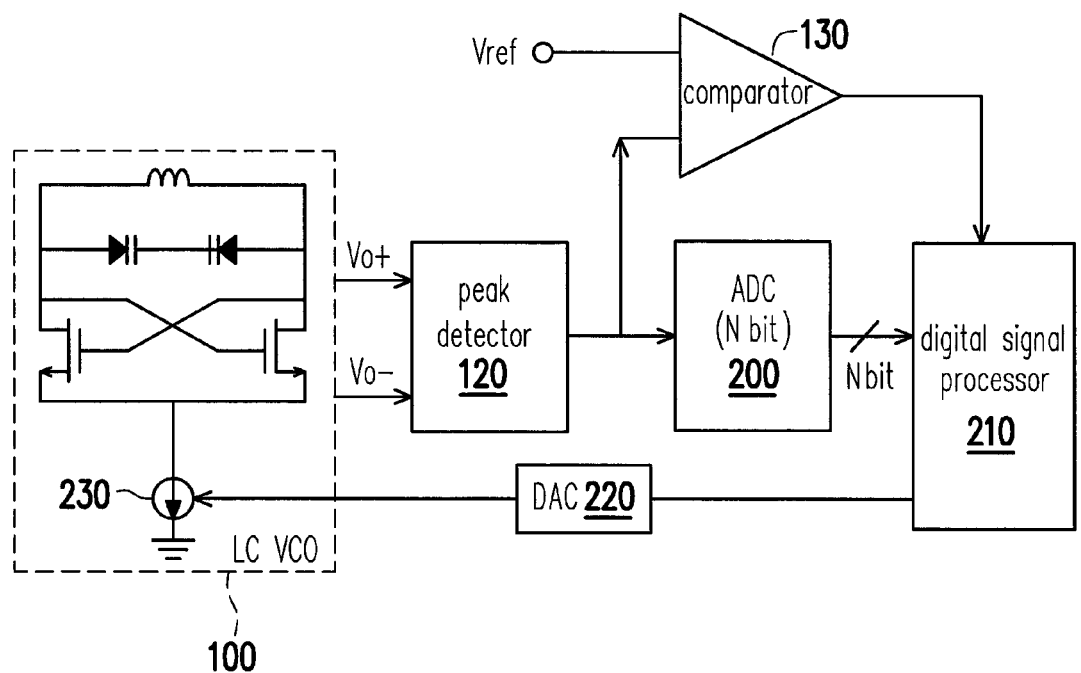
FIG. 7 is a drawing, schematically illustrating a circuit of LC VCO according to an embodiment of the invention.

FIG. 7 is a drawing, schematically illustrating a circuit of LC VCO according to an embodiment of the invention. In FIG. 7, based on the circuit in FIG. 4, it may further have alternative option by directly combining the circuits in FIG. 1 and FIG. 4. Both the ADC circuit 200 and the comparator 130 receive the output of the peak detector 120. The digital signal processor 210 can detect whether or not the output amplitude has reached to the saturation condition or the current has reached to the saturation condition.

In other words, the processor 150 in FIG. 3 or the digital signal processor 210 in FIG. 7 provides the current control signal to control the LC VCO, according to the averaged voltage value or the comparison signal, when the average voltage value has not reached to the level corresponding to the critical current yet. After the current control signal has reached to the critical current, the current control signal can be set within a variance range near to the critical current. It can be about the critical current in an example.

In addition, as to controlling the current of the LC VCO 100, the M-bit current control signal can be converted into analog signal by a digital-to-analog converter (DAC) 220. In accordance with the analog current control signal, the current source unit 102 of the LC VCO 100 is change to the analog current source 230, which can be directly modulated by the analog current control signal.

Figure 8:
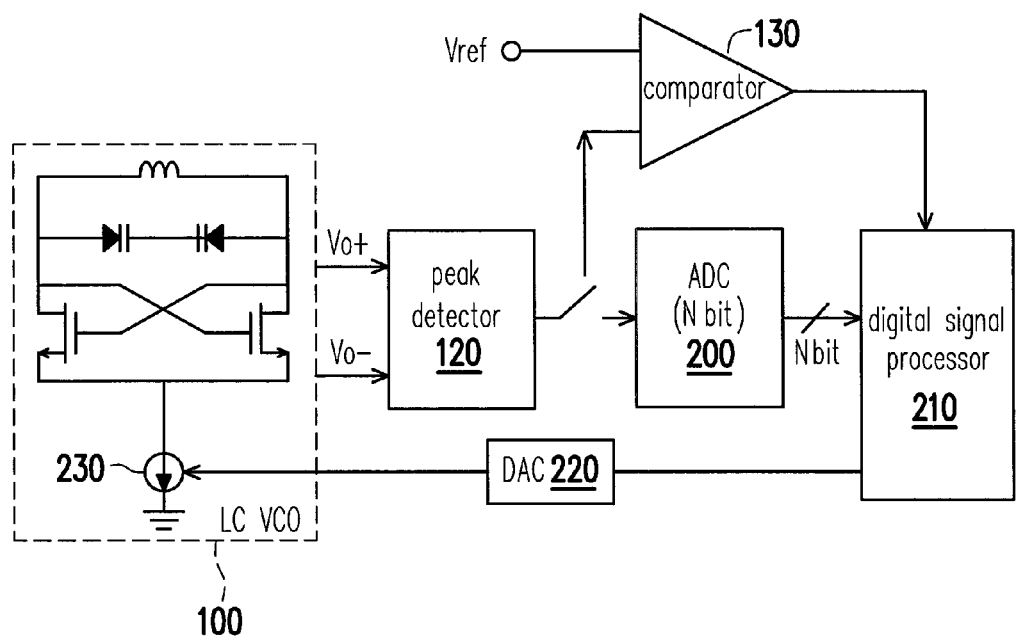
FIG. 8 is a drawing, schematically illustrating a circuit of LC VCO according to an embodiment of the invention.

FIG. 8 is a drawing, schematically illustrating a circuit of LC VCO according to an embodiment of the invention. In FIG. 8, if the circuit in FIG. 6 is taken as the base and is further combined with current control mechanism in FIG. 7, the current source unit 102 of the LC VCO 100 is the analog current source 230 to receive the current control signal in analog form from the DAC 220.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A circuit of inductance/capacitance voltage control oscillator (LC VCO), comprising:
   an LC VCO unit, receiving a current control signal and outputting an oscillating voltage signal;
   a peak detector, receiving the oscillating voltage signal to obtain an averaged voltage value; and
   a processing unit, receiving the averaged voltage value to accordingly output the current control signal and feedback to the LC VCO unit,
   wherein the processing unit also detects whether or not the averaged voltage value has reached to a saturation state and a critical current corresponding to the saturation state, wherein after the current control signal reaches to the critical current, the current control signal is set within a variance range near the critical current.

2. The circuit of LC VCO in claim 1, wherein the processing unit comprises:
   an analog-to-digital converting circuit, to convert the averaged voltage value into a digital voltage value; and
   a digital processing unit, detecting the averaged voltage value to know whether or not the critical current has been reached, and the current control signal being output to the LC VCO unit.

3. The circuit of LC VCO in claim 1, wherein the current control signal output from the processing unit is a digital signal,
   wherein a current source unit of the LC VCO unit comprises a plurality of current source units, activated according to the current control signal.

4. The circuit of LC VCO in claim 1, wherein the current control signal outputted from the processing unit is an analog signal,
   wherein a current provided by a current source unit of the LC VCO unit is controlled by the analog signal.

5. The circuit of LC VCO in claim 1, wherein the current control signal is corresponding to the critical current detected by the processing unit with respect to a minimum of phase noise.

6. The circuit of LC VCO in claim 1, further comprising a switching circuit and a comparator,
   wherein the comparator receives a reference voltage and the averaged voltage value to output a comparison signal to the processing unit,
   wherein the processing unit controls the LC VCO unit according to the comparison signal.

7. A circuit of LC VCO comprising:
   an LC VCO unit, receiving a current control signal and outputting an oscillating voltage signal;
   a peak detector, receiving the oscillating voltage signal to obtain an averaged voltage value;
   a comparator, receiving a reference voltage and the averaged voltage value, to output a comparison signal to indicate whether or not the averaged voltage value has reached to a level of the reference voltage; and
   a processing unit, receiving the averaged voltage value and the comparison signal,
   wherein the processing unit detects whether or not the averaged voltage value has reached to a saturation state and a critical current in correspondence,
   wherein when the averaged voltage value has not reached to the saturation state yet, the processing unit provides the current control signal to control the LC VCO, according to the averaged voltage value or the comparison signal,
   wherein after the current control signal reaches to the critical current, the current control signal is set within a variance range near the critical current.

8. The circuit of LC VCO in claim 7, wherein the processing unit comprises:
   an analog-to-digital converting circuit, to convert the averaged voltage value into a digital voltage value; and
   a digital processing unit, detecting the averaged voltage value to know whether or not the critical current has been reached, and outputting the current control signal to the LC VCO unit,
   wherein the processing unit also receives the comparison signal outputted from the comparator, and provides the current control signal according to the averaged voltage value or the comparison signal to control the LC VCO unit.

9. The circuit of LC VCO in claim 7, wherein the current control signal outputted from the processing unit is a digital signal,
  wherein a current source unit of the LC VCO unit comprises a plurality of current source units, activated according to the current control signal.

10. The circuit of LC VCO in claim 7, wherein the current control signal output from the processing unit is an analog signal,
  wherein a current provided by a current source unit of the LC VCO unit is controlled by the analog signal.

11. The circuit of LC VCO in claim 7, wherein the current control signal is corresponding to the critical current detected by the processing unit with respect to a minimum of phase noise.

\* \* \* \* \*